United States Patent [19]
Takimoto et al.
[11] 3,801,328
[45] Apr. 2, 1974

[54] PHOTOPOLYMER PRINTING PLATE AND ITS PRODUCTION

[75] Inventors: Yasuyuki Takimoto, Osaka; Toshikazu Yoshikawa, Amagasaki; Kiyomi Sakurai, Osaka; Yasusi Umeda, Osaka; Takeshi Hirayama, Osaka, all of Japan

[73] Assignee: Nippon Paint Company, Ltd., Oyodu-ku, Osaka, Japan

[22] Filed: Feb. 11, 1972

[21] Appl. No.: 225,588

Related U.S. Application Data

[63] Continuation-in-part of Ser. No. 126,998, March 22, 1971, abandoned.

[30] Foreign Application Priority Data

Mar. 27, 1970 Japan ............................ 45-25808

[52] U.S. Cl. ................ 96/115 P, 96/36.3, 96/35.1, 96/86 P

[51] Int. Cl. ............................................ G03f 7/10

[58] Field of Search ... 96/115 P, 35.1, 86 R, 115 R, 96/86 P, 33, 36.3, 36

[56] References Cited

UNITED STATES PATENTS

| | | | |
|---|---|---|---|
| 3,070,442 | 12/1962 | Cohen et al. | 96/35.1 |
| 3,100,150 | 8/1963 | Chismar | 96/93 |
| 3,278,304 | 10/1966 | Conix et al. | 96/115 P X |
| 3,279,919 | 10/1966 | Laridon et al. | 96/115 P X |
| 3,241,973 | 3/1966 | Thommes | 96/115 P |
| 2,791,504 | 5/1957 | Plambeck | 96/86 R X |
| 2,902,365 | 9/1959 | Martin | 96/115 P X |
| 3,630,746 | 12/1971 | Takimoto et al. | 96/115 P |
| 3,073,699 | 1/1963 | Firestein | 96/115 P |
| 3,615,435 | 10/1971 | Chu et al. | 96/115 P |
| 3,677,755 | 7/1972 | Fukui et al. | 96/115 P |
| 2,993,789 | 7/1961 | Crawford | 96/35.1 |
| 2,522,771 | 9/1950 | Barnes et al. | 96/93 X |
| 2,927,023 | 3/1960 | Martin | 96/35.1 |
| 3,004,851 | 10/1961 | Brown | 96/93 |
| 3,046,127 | 7/1962 | Barney et al. | 96/115 P X |

FOREIGN PATENTS OR APPLICATIONS

| | | | |
|---|---|---|---|
| 834,337 | 5/1960 | Great Britain | 96/115 P |

*Primary Examiner*—Charles L. Bowers, Jr.
*Attorney, Agent, or Firm*—Raymond P. Niro

[57] ABSTRACT

A photopolymer printing plate developable with water which comprises a support material, the adhering surface of which is abraded, and a layer of a water-soluble photosensitive resin composition comprising at least one unsaturated ethylenic compound, preferably having a boiling point above 100°C., a molecular weight below 1,500 and one to four polymerizable ethylenic groups, said ethylenic compound being polymerizable by means of actinic light in the presence of a photopolymerization initiator, a photopolymerization initiator and a partially saponified polyvinyl acetate. The plates may be used as printing plates as such or can be used to prepare relief images.

20 Claims, No Drawings

PHOTOPOLYMER PRINTING PLATE AND ITS PRODUCTION

This application is a continuation-in-part of copending application Ser. No. 126,998, filed on March 22, 1971, now abandoned.

The present invention relates to photopolymerizable elements and to printing plates developable with water, said plates being directly utilizable as printing plates per se and also being useful for the production of relief images.

Several photopolymer printing plates prepared by using various photopolymerizable compositions are available on the market. Insofar as photopolymer printing plates are concerned, it is desirable to have the ability to produce final printing plates that are easily developed yet sufficiently hard to enable repeated use. Heretofore, organic solvents or aqueous alkaline solutions have been used in the preparation, e.g., developing, of the known photopolymer plates. The developing process for such plates, is complex because the preparation of the developing chemicals is complicated, and give rise to a host of problems that cannot be avoided. If the solvent preparation is not done properly, for example, printing plates having desired properties cannot be obtained. In contrast, a photopolymer composition developable with plain water is capable of avoiding troublesome preparations and also removes the danger of mistaken preparations. With the use of water, potential poisoning to workers and drainage problems inherent with the use of harsh developing liquids can be avoided. Moreover, the cost of developing is reduced since the need for expensive solvent developers is eliminated.

The present inventors' previously discovered a photopolymerizable element for printing plates having some of these desired properties. That invention is described in detail in copending U.S. application Ser. No. 791,189, filed Jan. 14, 1969, now Pat. No. 3,630,746, and Belgian Pat. No. 764,884. The photopolymerizable compositions described therein are utilizable for preparing printing plates by photopolymerization. But problems arise because heavy metal uranyl salts are used as photo initiators, because separate antihalation and adhesive layers are required for the plates, and because the photopolymerizable composition employed in the described method does not have the requisite combinations and proportions of components to achieve the desired properties of adhesion, durability, hardness and water-washability.

Specifically, uranyl salts are used in photoinitiators and hance surfactants must be employed to help disperse the initiators in the resin composition. The same is true when water-insoluble benzoin type initiators are employed and the result, of course, is added expense and complexity.

Moreover, these methods have the additional defect of exhibiting rather poor adhesiveness between the photopolymerizable composition obtained thereby and the supporting material, such as aluminum or steel, which supports the photopolymerizable composition. In fact, it has been observed that in some embodiments, the layer of photopolymerizable composition tends to peel away from the supporting material even though a separate adhesive or anchor layer is used for the plate.

In addition to having separate adhesive and photopolymerizable composition layers, however, plates made from such known methods require the use of a separate antihalation layer to reduce the tendency of light, which passes through the photopolymerizable composition, from reflecting in different directions from the metallic supporting material. Finally, as noted above, the specific photopolymerizable composition previously disclosed, does not exhibit the desired balance of properties, e.g., hardness, durability, water-washability and adhesion, that are required for making low cost, efficient printing plates.

One of the objects of the present invention, therefore, is to provide a photopolymerizable elements and a photopolymer printing plate that is free of the defects of such known methods.

Another object of this invention is to provide a printing plate that is developable with water, yet remains hard and durable.

Still another object of the invention is to provide photopolymerizable printing plates that can be used as printing plates as such and also for producing relief images.

A further object of the invention is to eliminate the need for separate antihalation and adhesive layers in the plate.

Finally, still another object of the invention is to provide a unique formulation of components for the photopolymerizable composition to make it hard and durable, yet adhesive and water-washable.

These and other objects and advantages of the present invention will become apparent to those skilled in the art from a consideration of the following specification and claims.

The photopolymerizable composition of the present invention generally comprises the following three components: (a) at least one unsaturated ethylenic monomer, preferably having a boiling point above 100°C., a molecular weight below 1,500 and one to four polymerizable ethylenic groups, and being polymerizable by actinic light in the presence of a photopolymerization initiator; (b) a photopolymerization initiator; and (c) a partially saponified polyvinyl acetate, namely a polymer having both acetyl groups and hydroxy groups produced by saponification of polyvinyl acetate and the like and being water-soluble and compatible with the monomer component of (a).

It has been observed and this invention recognizes that the following ratios by weight of the above components results in the formation of photopolymerizable composition having the desired balance of properties: component *a*, about 0.1 to 3.0 parts; component *b*, about 0.001 to 0.15 parts; and component *c*, about 0.1 to 1.0 parts. Naturally, it should be understood that these suggested ratios, although experimentally determined to be desirable and preferred, can nonetheless be altered, if desired, depending on the particular use that is contemplated for the printing plates. In addition, about 0.01 to 0.3 percent based upon the amount of component *a*, of a thermal polymerization inhibitor can also be incorporated in the composition as a fourth component.

The ethylenic unsaturated monomer, e.g., component *a*, used in the practice of this invention generally comprises: (1) an acrylic or methacrylic ester of a lower alkanol having one or more hydroxy groups, or (2) an acrylic or methacrylic ester of polyethylene glycol [HO $(CH_2CH_2O)_nH$] which is etherified or esterified at one end thereof or (3) mixtures of both 1 and 2. Examples of unsaturated ethylenic compound are (1) B-hydroxyethel acrylate, B-hydroxyethyl methacrylate, B-hydroxypropyl acrylate, and B-hydroxypropyl methacrylate, wherein *n* is 1, the compound being esterified at one end of the diol, and (2) methoxypolyethylene glycol monoacrylate, methoxypolyethylene glycol monomethacrylate, and polyethylene glycoldiester (e.g., polyethylene glycol diacrylate or polyethylene glycol dimethacrylate), being an acrylic or methacrylic half ester of polyethylene glycol and being etherified or esterified at the hydroxy group on the opposite side from the ester moiety of the molecule. In the said polyethylene glycol derivatives (2), *n* is preferably 1 and 9 to 23, i.e., the number of ethylene oxide units is either one or nine to 23. Within this range of n, the ethylenic compound is compatible with the other components in the preparation of the photopolymerizable composition, and the resulting composition shows an excellent water-solubility in the preparation of a printing plate. Further, other effective compounds such as glycerol dimethacrylate, pentaerythritol dimethacrylate, trimethylolpropane tri methacrylate, trimethylol ethane trimethacrylate, and tetramethylolmethane tetramethacrylate may be used solely or in combination.

It should be recognized that the ethylenic unsaturated monomer component *a* can include mixtures of both mono- and di-functional compounds, the monofunctional compounds serving as solubilizing materials for the initiator component, and the di- or polyfunctional compounds enhancing the adhesive characteristics of the resultant photopolymerizable composition. Thus, by using both the water-soluble monofunctional ethylenic unsaturated compound and a water-soluble polyfunctional ethylenic unsaturated compound, the highly desirable balance of properties, e.g., water-washability and high adhesion, can be imparted to the photopolymerizable composition.

As the initiator component *b*, benzoin alkylate compounds, preferably having one to eight carbon atoms, are used. Benzoin alkylate compounds are preferred because they are capable of forming a transparent photopolymerizable layer. In addition, they are soluble in the ethylenic unsaturated component *a* and are excellently compatible with the other components in the aqueous composition. Moreover, since benzoin alkylate compounds are not decomposed thermally below about 100°C., they do not harden or become insoluble with heating during the preparation of the photopolymerizable composition. Specific examples of the benzoin alkylate compounds found useful in the practice of this invention are methyl, ethyl, isopropyl, octyl, vinyl and allyl ethers of venzoin, i.e., benzoin methyl ether, benzoin ethyl ether, benzoin vinyl ether, benzoin allyl ether, etc. The presently preferred initiator is benzoin isopropyl ether because of its unexpectedly high solubility in the monomer components of this invention.

Although ordinary photopolymerization requires a photoinitiator such as anthraquinone compounds in addition to the polymerization initiators discussed above, a high photosensibility can be attained in the present invention without a photoinitiator such as anthraquinone but instead by using a benzoin alkylate initiator alone.

The polymer component *c*, used in the practice of this invention is a partially saponified polyvinyl acetate, preferably having an average degree of polymerization of 300 to 2,000 and a saponification degree of 65 to 99 mole percent. If a suitable partially saponified polyvinyl acetate cannot be obtained by saponifying polyvinyl acetate having a low saponification degree as a homopolymer, a copolymer obtained, for example, by copolymerizing vinyl acetate with maleic anhydride can by partially saponified to give the desired polymer. Saponification as used herein is intended to mean the conversion of ester groups or the like into alcohol groups and the saponification degree represents the extent to which ester groups or the like have been converted to alcohol or hydroxy groups.

The hardness of the obtained printing plate as well as the speed of washing out in the developing procedure depends directly on the degree of saponification. Thus to accomplish the desirable balance properties referred to above, it is preferred that the partially saponified polyvinyl acetate have a degree of saponification within the stated range in saponifying polyvinyl acetate. There are some cases, for example, wherein a certain degree of saponification is required for compatibility with certain monomer components. Thus, it has been recognized that the required degree of saponification may be obtained by mixing two or more partially saponified polyvinyl acetate polymers having different degrees of saponification and calculating the arithmetic average of the different degrees of saponification. Mixtures of two or more polymers can be used, therefore, each having a different saponification degree; to obtain the desired average saponification degree for any given monomer component. This feature of the present invention adds significant flexibility to the formulation process and contributes significantly to the balance properties that are desired for the photopolymerizable composition.

Among the thermal polymerization inhibitors useful in the practice of this invention are 2,6 di-t-butyl-p-cresol, hydro quinone, and p-methoxyphenol. The preferred inhibitor is di-t-butyl-p-cresol because of its compatibility with the other components.

The noval photopolymerizable composition of the invention can be cast directly on the metallic supporting adhesive layer. In place of an antihalation layer, small amounts of dyestuffs may be added to the photopolymerizable composition. Sufficient amounts are added to the photopolymerizable composition just below that at which the composition becomes hazy. Examples of an effective dyestuff are rose bengal, eosine, methylene blue, and malachite green. These dyestuffs may be used solely or in combination in a ratio of 3 to 20 ppm based on the amount of the photopolymerizable composition.

An aluminum plate or an iron plate may be used as the metallic base or support for the photopolymerizable composition. These plates should be previously subjected to a chemical treatment to prepare the surface thereof for strong adhesion with the photopolymerizable composition. This roughening or abrading of the plate surface, of course, eliminates the need for the separate anchor or adhesive layer previously employed. For example, an iron plate is treated with certain compounds to change its grey color into a light black color, whereby an antihalation function is imparted thereto. Whether an adhesive layer is present or not, the photopolymerizable layer changes from the liquid phase, via an intermediary gel phase, into a solid phase. The thickness for an ordinary letterpress printing plate is 10 to 60 mils.

The following methods are advantageously used to prepare the surface of the metal plate Method A An iron plate defatted with suitable solvent is immersed in a surface treating agent comprising phosphoric acid (1 part by weight), nitric acid (1.5 parts by weight), zinc ion (0.2 part by weight) at 40 to 60°C. for 1 to 10 minutes, washed with water and dried so as to form a coating film of 3.0 to 7.0 g/m$^2$ giving a roughness of 1.5 $\mu$ or more on the surface.

Method B

An aluminum plate is immersed in a surface treating agent comprising sodium bichromate (1.0 part by weight), conc. sulfuric acid (10 parts by weight) and water (30 parts by weight) at 70 to 80°C. for about 20 minutes. Then, the plate is immersed in boiling water for about 20 minutes, washed with water and dried.

Method C

An aluminum plate is roughened by the use of sand of 600 mesh to give a roughness of 5 to 15$\mu$ on the surface.

A printing plate can be prepared by putting a photopolymerizable layer in contact with a halftone negative or line negative and exposing it to actinic light. A light having an abundance of ultravoilet rays is preferred as the light source because the photopolymerization initiator begins to polymerize by means of the irradiation of ultraviolet rays. Examples of the light source include a carbon arc lamp and a mercury vapor lamp, and among these an ultra high pressure mercury lamp ("Jet Light", made by ORC Mfg. Co., Japan) is preferred. After irradiation with the UV rays, the non-exposed area of the photopolymerizable layer is washed out with water to give a relief image printing plate. The depth of the relief is ordinarily 3 to 30 mils, depending upon its intended use. Such depth may be attained by adjusting the thickness of the photopolymerizable layer.

One of the important advantages of this invention resides in the fact that the resulting photopolymer printing plate is developable simply with water. Most of the currently known printing plates are developed either with an organic solvent or an aqueous solution of an alkali metal hydroxide. However, a photopolymer printing plate which can be developed with water alone is provided by the present invention. Thus, in this invention, a water-soluble base polymer such as partially saponified polyvinyl acetate, is used to form a photopolymerizable composition prepared by adding polymerizable monomers to the said partially saponified polyvinyl acetate. The monomer components are polymerized by exposing the photopolymerizable composition to light, whereby the base polymer induces a chain transfer reaction together with the pro duction of a homopolymer. Since the portion of the base polymer which undergoes the chain transfer reaction and the polymer formed from the monomers become united, the water-insolubility of the plate is elevated markedly.

It has been recognized in the practice of this invention that a composition containing water-soluble base polymer and a momopolymer polymerized from other monomers has such a strong water-solubility that often times the resultant relief image is weak. In the present invention, however, the grafting of the homopolymer to the base polymer is generated at the same time as the homopolymerization of the monomers by using the partially saponified polyvinyl acetate, whereby the resultant composition attains complete water-insolubility. This unexpected result is realized by using the above-described partially saponified polyvinyl acetate, and it has been observed that a water-soluble polymer thus prepared attains an excellent balance of physical properties and is far superior to any other known compositions. In addition, this partially saponified polyvinyl acetate of this invention affords many other advantages (i.e., easy availability, low cost, stability of properties such as polymerization degree, etc.) in comparison with other water-soluble polymers, such as cellulose derivatives.

When a photopolymer plate prepared by the practice of this invention is used as a direct printing plate or as an original plate for paper mache, a hard relief image is required. In such cases, the ratio of the amounts of the monomers may be varied to provide the required hardness. This is accomplished by adjusting the relative amounts of mono- and polyfunctional monomers in the ethylenic unsaturated monomer component. Thus, for example, the amount of the monofunctional monomer is reduced and the amount of the polyfunctional monomer increased when the resulting plate is used as an original plate for a paper mache. The hardness of the resultant composition can be maintained by spraying a water repellent over the thus-obtained relief image.

Ethylene glycol monoacrylates and polyethylene glycol diacrylates have preferred monomeric components. Since the partially saponified polyvinyl acetate has acetyl groups in the molecule, it is highly compatible with monomers having a low affinity for water and, in fact, partially saponified polyvinyl acetate functions as a protective colloid that enables uniform emulsification of water-soluble monomers. Thus, by proper selection of a partially saponified polyvinyl acetate, and mono- and polyfunctional monomers, a unique polymerizable composition having an unusual balance of properties, e.g., water-washability, hardness, durability etc., is achieved.

Presently preferred and practical embodiments of the present invention are illustratively shown in the following examples. All parts and percentages are by weight unless otherwise indicated.

Example 1

A mixture of partially saponified polyvinyl acetate (average polymerization degree, 500; saponification degree, 87.7 mol%) (30 parts) and water (35 parts) is kneaded in a kneader at 90 to 95°C. for half an hour. After finishing the kneading, the temperature within the kneader is lowered to 60°C. To this mixture, there is added dropwise a mixture of B-hydroxyethyl methacrylate containing 0.1 percent by weight of hydroquinone (30 parts), tetradecaethylene glycol dimethacrylate (0.3 part) and benzoin isopropyl ether (0.9 part) over a period of half an hour to give a photopolymerizable composition, which is cast on a metal plate that has previously been treated according to Method A to give a photopolymer plate. The resultant plate hardens upon exposure to actinic light, and nonexposed areas are washed away with water. The hardened areas are strong and durable.

Example 2

Partially saponified polyvinyl acetate (average polymerization degree, 500; saponification degree, 80.5 mol%) (70 parts), partially saponified polyvinyl acetate (average polymerization 500;. saponification degree, 88.5 mol%) (30 parts) and pure water (80 parts) are introduced into a kneader, and the resultant mixture is kneaded at 90 to 95°C. for half an hour. After the mixing is completed, the temperature within the kneader is lowered to 60°C. To this mixture, there is added dropwise a mixture of p-methoxyphenol (0.2 part), benzoin isopropyl ether (2.5 parts), trimethylolpropane trimethacrylate (8 parts) B-hydroxeyethyl methacrylate (100 parts) over a period of 40 minutes. A solution of rose bengal (0.025 part) in water (1 part) is added thereto. After the mixing is completed, the resultant mixture is defoamed under reduced pressure to give a photopolymerizable composition having a good adhesion to metal plates.

The thus prepared photopolymerizable composition is cast on a metal plate that was previously treated according to Method A. A polyvinyl chloride sheet is placed thereon. The resultant piled product is passed between two rolls so as to provide a resin composition thickness of 2.65 mm. After cooling, the polyvinyl chloride sheet is peeled off and the plate is dried in a dryer at 60°C. for about 30 minutes to give a photopolymer plate.

Example 3

The procedure of Example 2 is repeated except that ethylene-glycol dimethacrylate (5 parts) is used in place of trimethylolpropane trimethacrylate (8 parts) to give a photopolymerizable composition, which is cast on an aluminum plate as treated according to Method B. The plate is dried to give a photopolymer plate having an excellent balance of physical properties. The plate is water washable and the hardened areas are strong and durable.

Example 4

The procedure set forth in Example 2 is repeated except that tetramethylolmethane tetramethacrylate (5 parts) is used in place of trimethylolpropane trimethacrylate (8 parts) to give a photopolymerizable composition, which is cast on an aluminum plate as treated according to Method C. The plate is dried to give a photopolymer plate.

After conditioning the photopolymer plate as obtained above with carbon dioxide stream for 2 to 3 hours, it is put in contact with a half tone negative or line negative in a vacuum printing frame and exposed to light for 1 minute. A Jet Light (ORC Mfg. Co., Japan) (3 kw) is used as the light source from a distance of 70 cm. The printing plate is developed by spraying water (temperature, 35°C.) under a pressure of 4 kg/cm$^2$ on the unexposed part of the plate to elute it, whereby a relief image is obtained. Then the printing plate is dried at 100°C. for 3 minutes to give a relief printing plate. When required, post-irradiation with a mercury lamp may also be used, and the drying can be combined with the post-irradiation by employing a mercury lamp as the irradiation means in the drier. A suitable angle of the relief printing plate from the horizontal base is 50 to 90°. The obtained printing plates are utilizable for direct printing and also as original plates for a paper mache. Heretofore, paper mache has been made from metal photoengraving plates, however, it has not been possible to make paper mache from the conventional photopolymerization printing plates. This is a significant advantage of the present invention and, since the photopolymer printing plates described herein can be developed with water, it can be seen that the present invention is industrially valuable from many points of view.

Although a number of specific embodiments have been disclosed herein, it should be understood that the present invention is in no way limited to the disclosed embodiments. Rather it is intended that various modifications and equivalents of the disclosed embodiments fall within the spirit and scope of the invention as defined by the following claims.

The embodiments of the invention in which an exclusive property or privilege is claimed are defined as follows:

1. A water-developable photopolymerizable composition, which upon exposure to actinic light forms a water-insoluble polymer, and which prior to exposure to actinic light is substantially water-soluble, comprising:

the combination of at least one water-soluble, monofunctional unsaturated ethylenic monomer, and at least one water-soluble polyfunctional unsaturated ethylenic monomer, the combination of said monomers capable of forming a polymer by photoinitiated polymerization in the presence of a polymerization initiator activatable by actinic light;

a partially saponified, water-soluble, polyvinyl acetate polymer compatible with said monomers, containing both acetyl and hydroxy groups, and having a polymerization degree of about 300 to 2,000, and a saponification degree of about 65 to 99 mole percent; and a benzoin alkylate initiator, compatible with said monomers and said polyvinyl acetate polymer, and activatable by actinic light.

2. The photopolymerizable composition of claim 1 wherein said partially saponified polyvinyl acetate polymer comprises one or more partially saponified polyvinyl acetate polymers having different saponification degrees, wherein the arithmetic average of the different saponification degrees, based upon the weight percent of each polymer, is within the range of about 65 to 99 mole percent.

3. The photopolymerizable composition of claim 1 further characterized by having the following ratios by weight of the respective components based upon the total weight of the composition, about 0.1 to 3.0 parts by weight of said combined unsaturated ethylenic monomers, about 0.001 to 0.15 parts by weight of said polymerization initiator, and about 0.1 to 1.0 parts by weight of said partially saponified polyvinyl acetate.

4. A photopolymerizable composition according to claim 3, further comprising about 0.01 to 0.3 percent by weight of a thermal polymerization inhibitor, based upon the weight of said unsaturated ethylenic monomers.

5. A photopolymerizable composition of claim 3 wherein said unsaturated ehtylenic monomers having a boiling point above about 100°C, a molecular weight below about 1500 and about 1 to 4 polymerizable ethylenic groups.

6. A photopolymerizable composition of claim 3 wherein said unsaturated ehtylenic monomers comprise at least one monofunctional monomer selected from the group consisting of an acrylic or methacrylic ester of a lower alkanol having at least one hydroxy group and at least one polyfunctional monomer selected from the group consisting of an acrylic or methacrylic ester of a polyethylene glycol having the structural formula [$HO(CH_2$ $CH_2$ $O)_nH$] and having an ether or ester group at the end opposite from said ester moiety, *n*, the number of ethylene oxide units in said polyethylene glycol ester, being either one or nine to 23.

7. A photopolymerizable composition according to claim 1, wherein said photopolymerization initiator is selected from the group consisting of benzoin methyl ether, benzoin ethyl ether, benzoin isopropyl ether, benzoin octyl ether, benzoin vinyl ether and benzoin allyl ether.

8. A photopolymerizable composition according to claim 4, wherein said thermal polymerization inhibitor is selected from the group consisting of 2, 6 di-t-butylcresol, hydroquinone and P-methoxyphenol.

9. A photopolymerizable composition according to claim 3, wherein said unsaturated ethylenic compound comprises at least one mono-functional member selected from the group consisting of B-hydroxyethyl acrylate, B-hydroxyethyl methacrylate, B-hydroxypropyl acrylate, B-hydroxypropyl methacrylate, and at least one polyfunctional member selected from the group consisting of methoxpolyethylene glycol monoacrylate, methoxypolyethylene glycol monomethacrylate, polyethylene glycol diacrylate, polyethylene glycol dimethacrylate, glycol dimethacrylate, pentaerythritol dimethacrylate, trimethacrylolethane trimethacrylate and tetramethylolmethane tetramethacrylate.

10. A water-developable photopolymerizable composition comprising the following ratios by weight of the respective components based upon the total weight of the composition:

about 0.1 to 3.0 parts by weight of a mixture comprising about 1 to 50 percent by weight of a polyfunctional ethylenic unsaturated monomer, based upon the total combined weight of ethylenic unsaturated monomers, and at least one monofunctional ethylenic unsaturated monomer, said mixture of monomers being capable of forming polymer by photoinitiated polymerization in the presence of a polymerization initiator activatable by actinic light; and about 0.1 to 1.0 parts by weight of a partially saponified, water-soluble, polyvinyl acetate polymer capable of serving as a backbone polymer for the grafting of the polymer formed by said mixture of unsaturated ethylenic monomers, said partially saponified polyvinyl acetate having an average polymerization degree of about 300 to 2,000 and an average saponification degree of about 65 to 99 mole percent and a benzoin alkylate initiator activatable by actinic light.

11. A photopolymerizable composition of claim 10 wherein said monofunctional unsaturated ethylenic monomer is selected from the group consisting of an acrylic or methacrylic ester of a lower alkanol having at least one hydroxy group and wherein said polyfunctional unsaturated ethylenic monomer is selected from the group consisting of an acrylic or methacrylic ester of polyethylene glycol having the structural formula [$HO$ $(CH_2$ $CH_2$ $O)_nH$] and having an ether or ester group at the end opposite from said ester moiety, the number, *n*, of ethylene oxide units in said polyethylene glycol ester being either one or nine to 23.

12. A photopolymerizable composition of claim 10 further characterized by having dyestuff antihalation material dispersed within said photopolymerizable composition.

13. A photopolymer printing plate developable with water which comprises a support material and a layer of water soluble photosensitive resin composition disposed thereon, said composition comprising the following components having the following respective ratios by weight based upon the total weight of the composition, about 0.1 to 3.0 parts by weight of a mixture comprising about 1 to 50 percent by weight of a polyfunctional ethylenically unsaturated monomer, based upon the total combined weight of ethylenically unsaturated monomers, and at least one monofunctional ethylenically unsaturated monomer, said mixture of monomers being capable of forming polymer by photoinitiated polymerization in the presence of a polymerization initiator activatable by actinic light, about 0.1 to 1.0 parts by weight of a partially saponified polyvinyl acetate having a degree of polymerization of about 300 to 2,000 and a degree of saponification of about 65 to 99 mole percent, and a benzoin alkylate initiator activatable by actinic light.

14. A photopolymer printing plate according to claim 13, further comprising about 0.01 to 0.3 percent by weight of a thermal polymerization inhibitor, based upon the weight of said unsaturated ethylenic monomers.

15. A photopolymer printing plate according to claim 13, wherein the partially saponified polyvinyl acetate comprises one or more partially saponified polyvinyl acetate polymers having different degrees of saponification and different degrees of polymerization, wherein the average degree of polymerization is 300 to 2,000 and average saponification degree is 65 to 99 mole percent.

16. A photopolymer printing plate according to claim 13, wherein said support material is a chemically or mechanically abraded metallic plate.

17. A photopolymer printing plate according to claim 16, wherein the metallic plate is a chemically or mechanically abraded aluminum or an iron plate.

18. A photopolymer printing plate according to claim 13, wherein said support material is a metallic plate.

19. A photopolymer printing plate according to claim 16, wherein the metallic plate is an aluminum, tin or galvanized steel plate.

20. A photopolymerizable composition according to claim 7 wherein said photopolymerization initiator is benzoin isopropyl ether.

* * * * *

UNITED STATES PATENT OFFICE
CERTIFICATE OF CORRECTION

Patent No. 3,801,328 Dated April 2, 1974

Inventor(s) Yasuyuki Takimoto, Toshikazu Yoshikawa, Kiyomi Sakur; Yasusi Umeda, Takeshi Hirayama It is certified that error appears in the above-identified patent and that said Letters Patent are hereby corrected as shown below:

Column 8, line 59, delete "ehtylenic" and substitute --ethylenic--.

Column 8, line 64, delete "ehtylenic" and substitute --ethylenic--.

Column 9, lines 17 & 18, delete "2, 6 di-t-butyl-cresol and substitute --2, 6 di-t-butyl-p-cresol--.

Column 9, line 24, after "methacrylate," add --methoxypoly-ethylene glycol monacrylate, methoxypolyethylene glycol monomethacrylate,--.

Column 9, lines 26 & 27, delete "methoxypolyethylene glycol monoacrylate, methoxypolyethylene glycol monomethacrylate,".

Signed and sealed this 19th day of November 1974.

(SEAL)
Attest:

McCOY M. GIBSON JR.
Attesting Officer

C. MARSHALL DANN
Commissioner of Patents